(12) United States Patent
Chen et al.

(10) Patent No.: US 10,168,938 B2
(45) Date of Patent: Jan. 1, 2019

(54) LDPC DECODER DESIGN TO SIGNIFICANTLY INCREASE THROUGHPUT IN ASIC BY UTILIZING PSEUDO TWO PORT MEMORY STRUCTURE

(71) Applicant: HUGHES NETWORK SYSTEMS. LLC, Germantown, MD (US)

(72) Inventors: Liping Chen, Germantown, MD (US); Mustafa Eroz, Germantown, MD (US); Yanlai Liu, Germantown, MD (US); Sri Bhat, Germantown, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 70 days.

(21) Appl. No.: 15/361,227

(22) Filed: Nov. 25, 2016

(65) Prior Publication Data

US 2018/0150253 A1 May 31, 2018

(51) Int. Cl.
*H03M 13/11* (2006.01)
*G06F 3/06* (2006.01)
*G06F 12/06* (2006.01)
*G11C 8/10* (2006.01)
*G11C 7/10* (2006.01)
*G11C 7/22* (2006.01)

(52) U.S. Cl.
CPC .......... *G06F 3/0634* (2013.01); *G06F 3/0613* (2013.01); *G06F 3/0659* (2013.01); *G06F 3/0679* (2013.01); *G06F 12/0607* (2013.01); *G11C 7/1039* (2013.01); *G11C 7/222* (2013.01); *G11C 8/10* (2013.01); *H03M 13/1111* (2013.01); *G06F 2212/1024* (2013.01); *G06F 2212/202* (2013.01); *G06F 2212/657* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,282,505 | B1 * | 8/2001 | Hanawa | G06F 12/0846 365/185.11 |
| 2011/0167192 | A1 * | 7/2011 | Iyer | G06F 12/06 711/5 |
| 2014/0177324 | A1 * | 6/2014 | Liu | G11C 8/16 365/154 |

* cited by examiner

*Primary Examiner* — Charles Rones
*Assistant Examiner* — Hewy H Li
(74) *Attorney, Agent, or Firm* — Nath, Goldberg & Meyer; Leonid D. Thenor

(57) ABSTRACT

A method and apparatus allows single port memory devices to be accessed as pseudo two port memory devices. An access table is created to map the single port memory device to a single port even bank and a single port odd bank. The single port memory device is then accessed based on the mapping. An initial number of entries from the access table are retrieved in order to read addresses in the memory device until a predetermined delay expires. Simultaneous operations are then performed to read from rows in the memory device and write to rows in the memory device. Once all memory addresses have been read, write operations are sequentially performed in rows of the memory device based on the remaining entries of the access table.

16 Claims, 14 Drawing Sheets

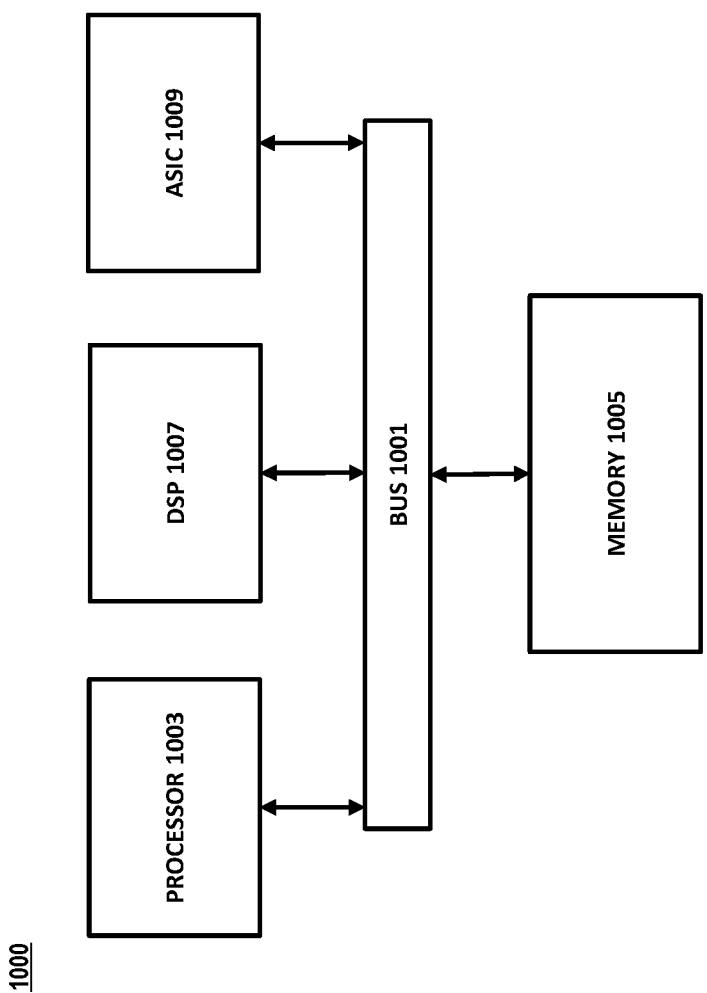

LDPC DECODER DESIGN TO SIGNIFICANTLY INCREASE THROUGHPUT IN ASIC BY UTILIZING PSEUDO TWO PORT MEMORY STRUCTURE

BACKGROUND INFORMATION

With the ever increasing demand for user data, there is also an ongoing demand for higher modulation. High modulation, however, typically requires shorter burst durations and correspondingly shorter decoder processing time. Conventional decoders employ single port memory architectures in order to reduce size and costs. Single port memory architectures only facilitate read or write access during a given CPU or bus clock cycle. Read and write operations cannot be simultaneously performed in the same clock cycle. Consequently, two clock cycles are required to complete operations that read and update (write) to memory such as those performed by low density parity check (LDPC) decoders.

Various hardware changes can be made to provide decoder configurations capable of meeting the demands of higher modulation. Such configurations, however, are typically accomplished with an increase in size and cost of the resulting device. For example, one or more single port memory devices can be replaced with dual port memory devices in order to facilitate simultaneous access to both read and write operations in one clock cycle. Dual port memory devices are physically larger (e.g., 2-3 times), have increased power consumption, and are more expensive than corresponding single port memory devices. Thus, while capable of meeting the modulation and processing demands, dual access memory devices increase the size and cost of the decoder. Furthermore, such increases can prohibit use of the decoder in devices with strict space limitations.

Another configuration for meeting the demands of higher modulation requires increasing the clock speed of the decoder. Such a configuration allows the use of existing single port memory devices and does not require changes to the decoder's processing engines. Increasing the clock speed of the decoder, however, will also increase the dynamic power consumption and possibly require redesigning some of the decoder logics. It will also be difficult to meet the timing constraints at a very high clock speed.

The number of processing engines in the decoder can also be increased together with a proportionate increase in the width of the memory device. Such configurations, however, will typically require an increase in logic size and high parallelism, which ultimately makes routing more difficult. Furthermore, the increased width of the memory device will occupy more space. Various combinations of the foregoing configurations can also be applied. However, the same disadvantages will persist.

Based on the foregoing, there is a need for an approach for significantly increasing decoder throughput to accommodate increased modulations and reduced burst durations, without significant increases in area and/or power.

BRIEF SUMMARY

An apparatus and method are disclosed for accessing single port memory devices as pseudo two port memory devices. According to an embodiment, the apparatus includes a single port memory device; a pseudo two port memory device including a single port even bank and a single port odd bank; and a controller, including microcode containing one or more instructions. The microcode configures the controller to: generate an access table for mapping the single port memory device to the pseudo two port memory device, sequentially retrieve entries from the access table, read from addresses in the single port memory device corresponding to n entries of the retrieved entries, where n corresponds to a pipeline delay measured in controller clock cycles, conduct simultaneous operations for reading from addresses in the single port memory device corresponding to remaining entries from the access table and for writing to addresses in the single port memory device corresponding to the remaining entries from the access table delayed by n clock cycles, until all addresses in the single port memory device corresponding to the retrieved entries have been read, and write to addresses in the single port memory device corresponding to any remaining entries from the access table. Reading and writing operations to the single port memory device are performed via the pseudo two port memory device.

According to another embodiment, the method includes: generating an access table for mapping a single port memory device to a pseudo two port memory device including a single port even bank and a single port odd bank; sequentially retrieving entries from the access table; reading from addresses in the single port memory device corresponding to n entries of the retrieved entries, where n corresponds to pipeline delay measured in CPU clock cycles; conducting simultaneous operations for reading from addresses in the single port memory device corresponding to remaining entries from the access table and for writing to addresses in the single port memory device corresponding to the remaining entries from the access table delayed by n clock cycles, until all addresses in the single port memory device corresponding to the retrieved entries have been read; and writing to addresses in the single port memory device corresponding to any remaining entries from the access table.

The foregoing summary is only intended to provide a brief introduction to selected features that are described in greater detail below in the detailed description. As such, this summary is not intended to identify, represent, or highlight features believed to be key or essential to the claimed subject matter. Furthermore, this summary is not intended to be used as an aid in determining the scope of the claimed subject matter.

BRIEF DESCRIPTION OF THE DRAWINGS

Various exemplary embodiments are illustrated by way of example, and not by way of limitation, in the figures of the accompanying drawings in which like reference numerals refer to similar elements and in which:

FIG. 10 is a diagram of a chip set that can be used to implement various exemplary embodiments.

DETAILED DESCRIPTION

An apparatus and method for accessing single port memory devices as pseudo two port memory devices are described. In the following description, for purposes of explanation, numerous specific details are set forth in order to provide a thorough understanding of the disclosed embodiments. Furthermore, various embodiments are discussed in connection with a decoder. It will become apparent, however, to one skilled in the art that various embodiments may be practiced without these specific details or with an equivalent arrangement. For example, features of the disclosed embodiments may be applied layered belief LDPC decoders, standard belief LDPC decoders, or any devices capable of utilizing a pseudo two port memory configuration to reduce processing time and/or increase access to a single port memory device. In other instances, well-known structures and devices are shown in block diagram form in order to avoid unnecessarily obscuring the various embodiments.

Figure 1A:
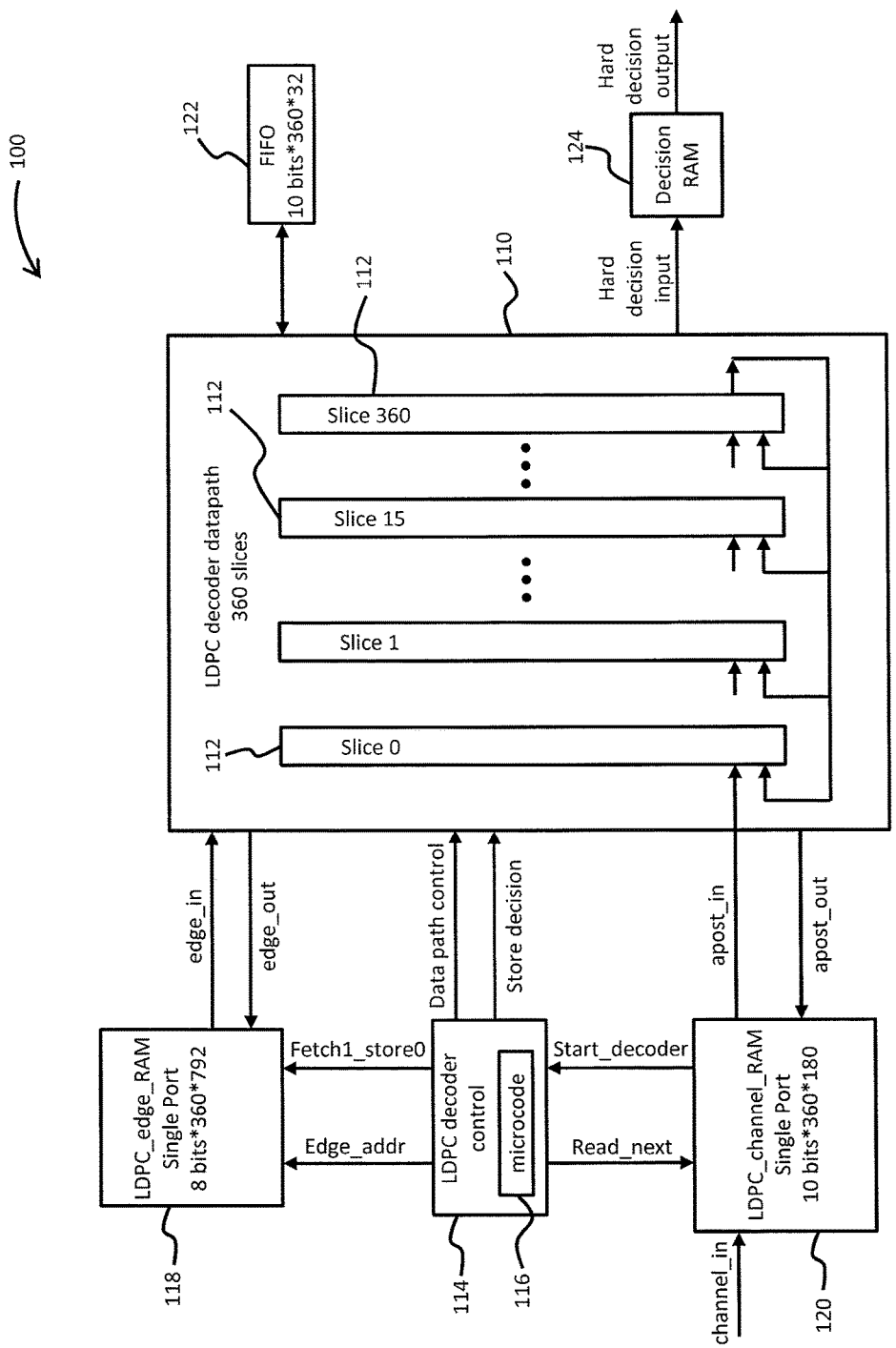
FIG. 1A is a diagram illustrating various components of a conventional LDPC decoder.

FIG. 1A illustrates components of a conventional decoder 100 which incorporates single port memory devices. The decoder 100 includes a computation engine 110 that is configured for performing various calculations and/or functions during operation of the decoder 100. As illustrated in FIG. 1A, the computation engine 110 can include a plurality of datapaths 112. The datapaths 112 can be configured to simultaneously perform various tasks. For example, each datapath 112 can be configured to retrieve specific information and simultaneously perform calculations specific to the information retrieved.

The decoder 100 also includes a controller 114 and microcode 116 in order to monitor and control all activities of the computation engine. More particularly, the microcode 116 can be stored in a non-volatile memory portion for execution by the controller 114. The microcode 116 would contain the necessary instructions which, upon execution by the controller 114, result in specific operations to control all aspects of the computation engine 110 and/or decoder 100. As illustrated in FIG. 1A, the decoder 100 also includes multiple memory devices, namely an edge RAM memory device 118, a channel RAM memory device 120, and a FIFO memory device 122. The memory devices (118, 120, 122) are in the form of single port devices which only allow one operation (e.g., read or write) per clock cycle. For example, during a given clock cycle, information can be read from, or written to, the channel RAM memory device 120. Read operations, however, cannot be performed simultaneously with write operations. Thus, in order to complete one read operation and one write operation with the channel RAM memory device 120, two clock cycles are required.

The memory devices (118, 120, 122) are typically configured as a single port devices because of the physical and cost constraints associated with the decoder 100. For example, the use of dual port memory devices could potentially increase the physical size of the decoder 100 by more than 30%. Additionally, the costs associated with producing the decoder 100 would greatly increase. Consequently, all the memory devices (edge RAM 118, channel RAM 120, and FIFO 122) are configured as single port devices, which require two clock cycles to perform one combined read/write transaction.

Figure 1B:
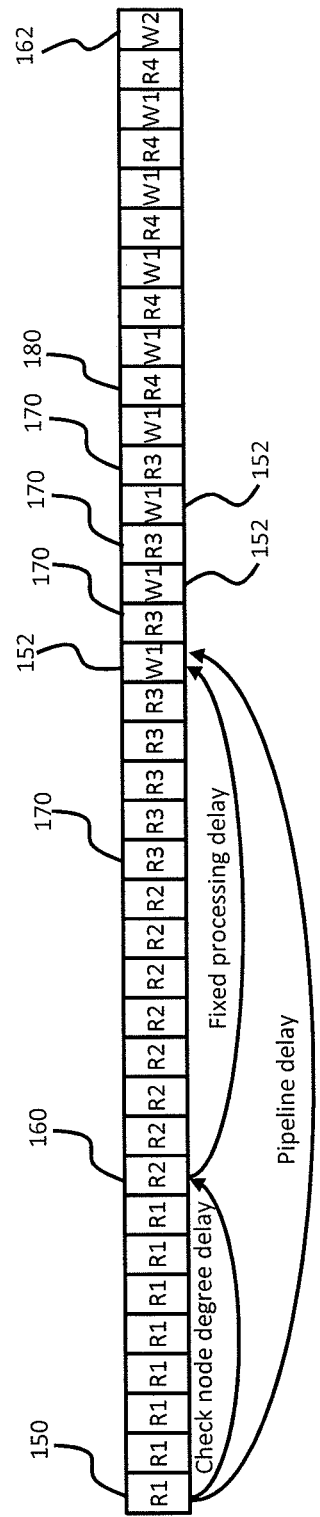
FIG. 1B is a diagram of memory access for LDPC decoder of FIG. 1A.

FIG. 1B illustrates memory access for the decoder 100 illustrated in FIG. 1A. During certain operations, it is necessary for the computation engine 110 to read/write information from/to the different memory devices (118, 120, 122). For example, according to one operation, the computation engine 110 reads information from the channel RAM memory device 120, performs various calculations, and subsequently writes the results of the calculations back to the same locations in the channel RAM memory device 120. As illustrated in FIG. 1A, the computation engine 110 contains 360 datapaths 112 that are capable of simultaneously processing information retrieved from various locations of the channel RAM memory device 120. The decoder 100 can generally include a channel RAM memory device 120 capable of storing information that is significantly larger than the size of the computation engine 110. This results in the computation engine 110 processing only a subset of the information contained in the channel RAM memory device 120 until the entire contents can be accessed.

For example, the computation engine 110 can perform a first series of read operations 150 (also denoted as R1) to access a portion of the contents stored in the channel RAM memory device 120. Next, the computation engine 110 processes the information read from the channel RAM memory 120 device during the first read operation 150. At the same time, the computation engine 110 performs a second read operation 160 (also denoted as R2) in order to access information from a subsequent portion of the channel RAM memory device 120. The amount of time (in clock cycles) required between the first read operation 150 and the second read operation 160 is based on a check node degree associated with computation engine 110. This is followed by a third read operation 170 (also denoted as R3) to access the next portion of the channel RAM memory device 120. Once the first read operation 150 has been performed, a fixed processing time is required before the information can be updated back to the channel RAM memory device 120. A pipeline delay associated with reading, processing, and writing to a given memory location can be determined as a sum of the check node degree delay and the fixed processing delay.

As previously discussed, read and write operations cannot occur simultaneously for single port memory devices. The calculation results from the first read operation (i.e., first write operation 152) and third series of read operations 170 are therefore interleaved. More particularly, as illustrated in FIG. 1B once the calculations are complete, a first write operation 152 is performed, followed by a third read operation 170, followed by another first write operation 152, followed by a third read operation 170, etc. Similarly, when the computation engine 110 performs a fourth read operation 180, it is interleaved with the remaining portion of the first write operation 152 and the second write operation 162.

Once the initial processing delay has expired, all subsequent read and write operations to the channel RAM memory device 120 are interleaved with one another. As a result, significant processing time (in terms of clock cycles) is required for each decoder iteration. More particularly, since the processing time is limited by memory access. Each memory address defined in the access table will be read once and written once during each decoder iteration. As a result, the total processing time will be 2*M+n, where M is the number of entries in the access table and n is the pipeline delay.

Figure 2:
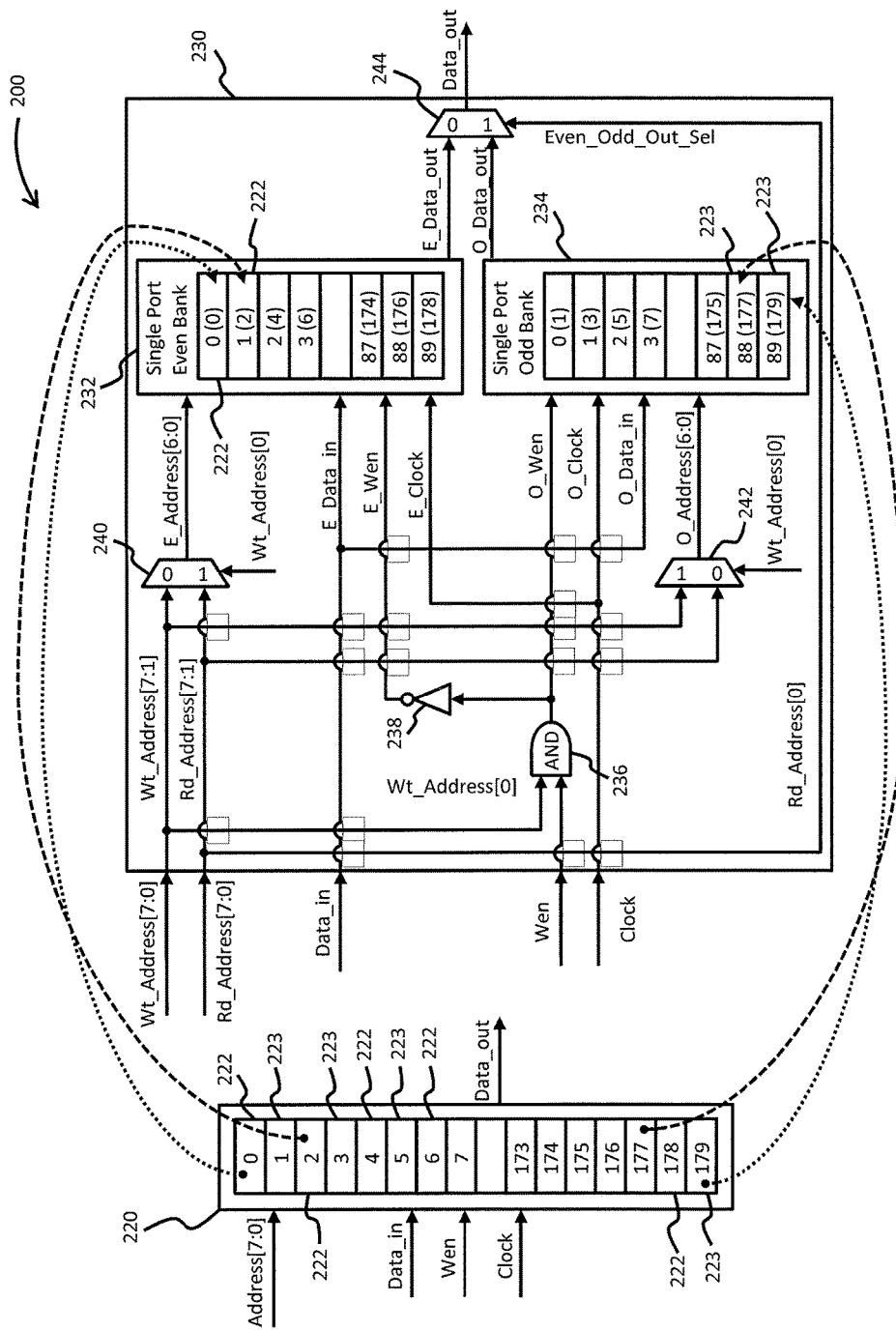
FIG. 2 is a diagram illustrating hardware for converting single port memory device to a pseudo two port memory device, according to one embodiment.

FIG. 2 illustrates hardware configuration for converting a single port memory device into a pseudo two port memory device, in accordance with at least one embodiment. For example, the single port memory device 220 (or simply ("memory device") can be a channel RAM memory device from which information will be accessed, processed, and updated. The memory device 220 is configured to have multiple rows of the same size. As illustrated in FIG. 2, the memory device 220 contains 180 rows. Each row has P columns, where P is the number of decoder datapath slices. For example, if the decoder contains 360 datapath slices, the memory device would function as a two-dimensional array which has 180 rows and 360 columns. The soft information which has multiple bits stored in each column will feed to one slice of the decoder's computation engine.

According to at least one embodiment, the memory device 220 is converted into a pseudo two port memory device 230 by mapping even numbered rows 222 to a single port even bank 232, and mapping the odd numbered rows 223 to a single port odd bank 234. As a result, rows 0, 1, 2, 3 . . . , of the single port even bank 232 contain values corresponding to rows 0, 2, 4, 6 . . . , of the memory device 220. Similarly, the first four rows of the single port odd bank 234 contain values corresponding to rows 1, 3, 5, and 7 of the memory device 220. As will be discussed in greater detail below, an access table can be uniquely created for allowing the computation engine to access odd and even rows of the memory device 220 as a pseudo two port memory device 230, thereby overcoming any potential read/write conflicts and reducing the processing time by up to 50 percent.

As illustrated in FIG. 2, the pseudo two port memory device 230 includes additional hardware which help facilitate simultaneous reading and writing to the memory device 220 during a single clock cycle. All of the signals received by the memory device 220 are also received by the pseudo two port memory device 230, with the exception of the address signal. Specifically, the memory device 220 receives an address signal (Address [7:0]) as input in order to determine the location to be used for any read or write operations. According to one or more embodiments, the pseudo two port memory device 230 simultaneously receives a read address signal (Rd_Address [7:0]) as well as a write address signal (Wt_Address [7:0]) as input. Both signals are provided to a first multiplexer 240 and a second multiplexer 242. The Data_in signal and Clock signal are provided to both the single port even bank 232 and the single port odd bank 234.

According to various embodiments, the computation engine is capable of performing simultaneous read and write operations using the pseudo two port memory device 230. This can be accomplished by accessing only odd/even sets of addresses. For example, one row 222 of the single port even bank 232 can be simultaneously accessed with one row 223 from the single port odd bank 234, and vice versa. According to at least one embodiment, this can be accomplished by applying an exclusive OR operation (XOR) to the last bits of the read and write addresses which must be simultaneously accessed. If the resulting XOR is true (i.e., returns a value of 1), then both addresses can be simultaneously accessed. As illustrated in FIG. 2, the last bit of the received write address (Wt_Address [0]) as well as the write enable signal (Wen) are both supplied to an AND gate 236 in order to generate an odd write enable signal (O_Wen) that is supplied to the single port odd bank 234. The output of the AND gate 236 is also supplied to a NOT gate 238 in order to generate an even write enable signal (E_Wen) that is supplied to the single port even bank 232. The output of the single port even bank 232 and the single port odd bank 234 are both supplied to a third multiplexer 244 so that both operations (e.g., read and write) can be performed simultaneously and without generating memory access conflicts.

As previously discussed, various calculations can be performed on the information stored in the memory device 220 in order to generate values for each bit which correspond to a soft decision. According to various embodiments, the calculations can be performed multiple times to continually update the soft decision until an acceptable confidence level is reached. The values for each bit can then be output as hard decisions. Thus, the process of simultaneously reading and writing to the memory device 220 can be repeated multiple times, thereby resulting in further reductions in processing time. Depending on the specific implementation, various known techniques can be applied to obtain an acceptable confidence level in the updated soft decisions. For example, such techniques can include, but are not limited to, algorithms that incorporate layered min-sum, parity check matrix, forced convergence, iterative convergence, etc. Additionally, the confidence level (or convergence criteria) can be set based, in part, on implementation requirements, level of accuracy, and processing time. Alternatively, the calculations can be performed a predetermined number of times without an explicit check for convergence. According to the illustrated embodiment, the pseudo two port memory device is embodied in a layered belief LDPC decoder. It should be noted, however, that the pseudo two port memory device can be also embodied in standard belief LDPC decoders, or any devices capable of utilizing a pseudo two port memory configuration to reduce processing time and/or increase access to a single port memory device.

Figure 3A:
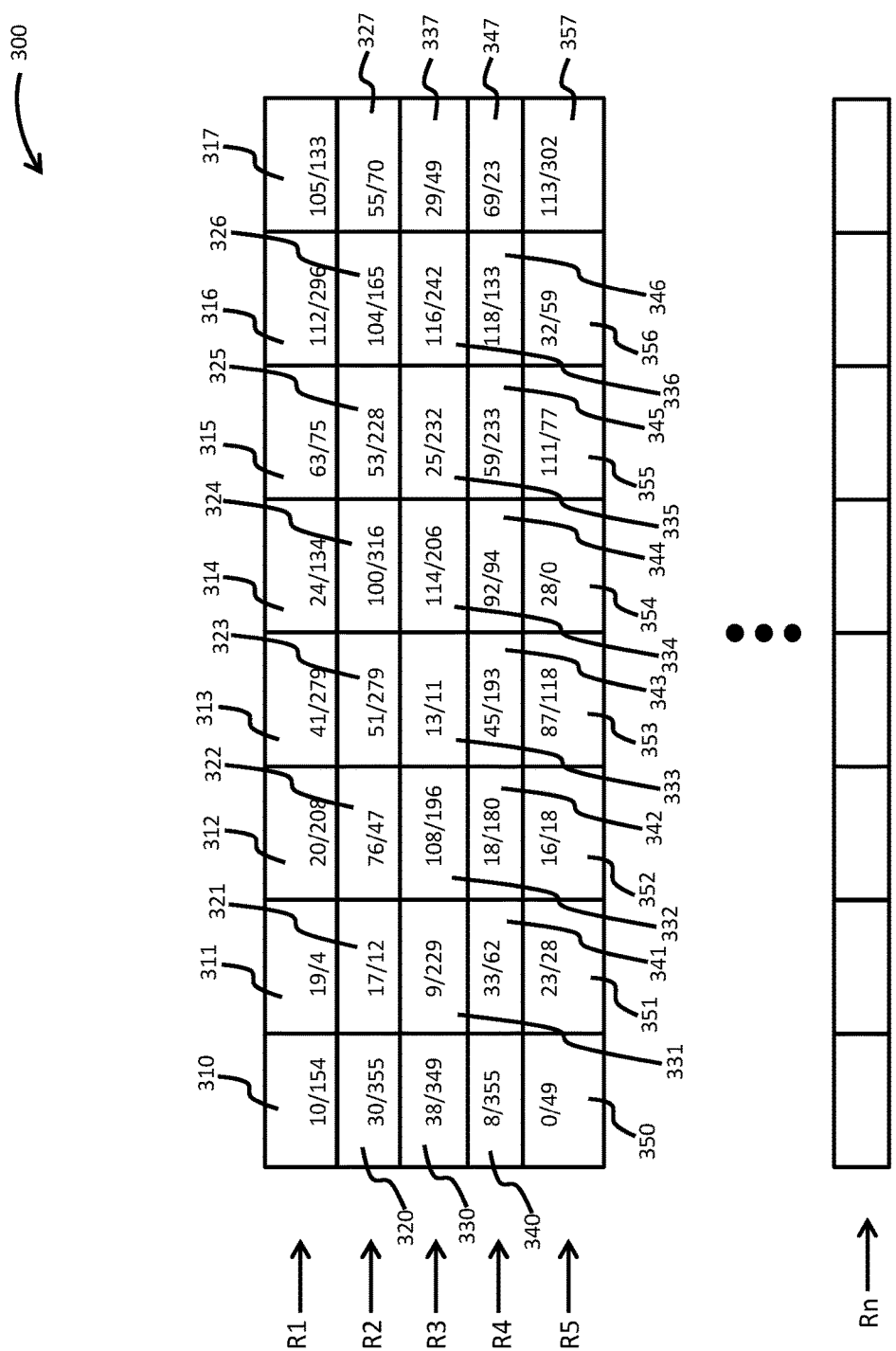
FIG. 3A illustrates a portion of a decoder access table for accessing the single port memory device as a pseudo two port memory device, according to one embodiment.

FIG. 3A illustrates a decoder table that can be used to facilitate access to the single port memory device 220 as a pseudo two port memory device 230, in accordance with at least one embodiment. The decoder table 300 includes a plurality of rows labeled R1, R2, R3, R4, R5, . . . Rn. While FIG. 3A only illustrates five rows and eight columns in the decoder table 300, it should be noted that such a value is not intended to be restrictive in any way. The number of rows and columns in the decoder table 300 can vary based on the code design criteria and parallelism of the processing engine. Each row of the decoder table 300 also includes a plurality of columns. According to the illustrated embodiment, a check node degree for accessing the memory device 220 is determined to be 8. Thus, each row of the decoder table 300 contains 8 columns. For example, Row 1 contains eight columns identified by reference numerals 310, 311, 312, 313, 314, 315, 316, and 317. Row 2 contains 8 columns identified by reference numerals 320, 321, 322, 323, 324, 325, 326, 327. Row 3 contains eight columns identified by reference numerals 330, 331, 332, 333, 334, 335, 336, and 337. Row 4 contains eight columns identified by reference numerals 340, 341, 342, 343, 344, 345, 346, and 347. Row 5 contains eight columns identified by reference numerals

350, 351, 352, 353, 354, 355, 356, and 357. Each entry in the decoder table 300 contains a row/column address value corresponding to the memory device 220.

As can be appreciated, a typical decoder table will contain significantly more rows and columns. For simplicity and purposes of illustration, however, the exemplary decoder table 300 illustrated in FIG. 3A only shows five columns and is set with a check node degree of 8 in order to utilize eight columns. The check node degree can vary based on code design criteria. According to at least one embodiment, the decoder table 300 is configured such that adjacent columns in a particular row alternate between odd and even values for the row address. For example, the first column 310 of Row 1 contains a value of 10/154, while the second column 311 contains a value of 19/4. Thus, referring to the entries in Row 1, it can be seen that rows of the memory device 220 being access are labeled as 10, 19, 20, 41, 24, 63, 112, and 105, which satisfies the even/odd alternating format. Additionally, column one 320 of Row 2 identifies row 30 of the memory device 220 in order to maintain the alternating nature of the decoder table 300.

Figure 3B:
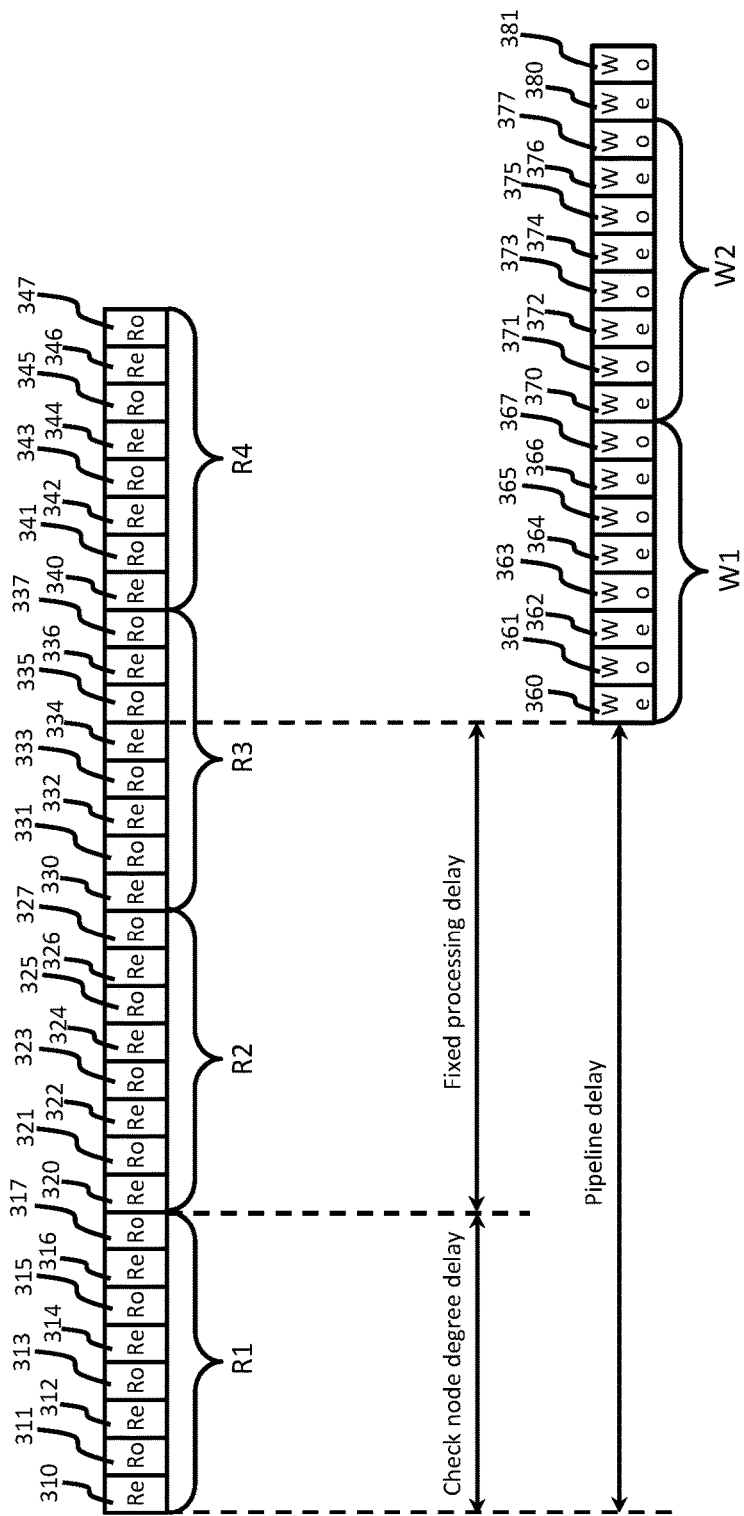
FIG. 3B is a diagram illustrating memory access for a pseudo two port memory device, according to one embodiment.

Referring additionally to FIG. 3B, a diagram is shown for illustrating memory access using the pseudo two port memory device 230, in accordance with one or more embodiments. Entries from Row 1 of the decoder table 300 are retrieved in order to access the memory device 220. More particularly, the content of each entry in the decoder table 300 can specify at least a row and column of the memory device 220 to be accessed. According to at least one embodiment, only the row specified in each entry of the decoder table 300 is used, and the contents of the entire row specified by the entry are read from the memory device 220. Thus, memory addresses (or memory row locations) can be read such that the rows alternate in even/odd fashion, as specified in the decoder table 300. Next, entries from Row 2 of the decoder table 300 are retrieved in order to determine which row of the memory device 220 will be read. Similarly, entries from Row 3 and Row 4 (as well as Row 5) are retrieved in order to identify additional rows of the memory device 220 which should be read.

According to at least one embodiment, once the contents of the memory device 220 have been read, the computation engine will start to perform various calculations and will update the contents of those memory row locations when completed. As previously discussed, the processing time (or processing delay) required to perform the necessary computations is fixed based on the specific configuration of the computation engine, check node degree, etc. The computation engine continues to process the content retrieved in the order specified by the decoder table 300 until the updated content for the first entry is ready. During this time, memory access proceeds as a single port memory device. Although the foregoing description describes entries form individual rows of the decoder table 300 being retrieved, it should be noted that each entry can be accessed individually or all entries from the entire decoder table can be accessed simultaneously. However, contents of the memory device 220 are accessed (either read or write) based on individual entries from the decoder table 300.

As illustrated in FIG. 3B, the pipeline delay corresponds to the sum of the check node degree delay and the fixed processing delay. The pipeline delay is the same for all contents of the memory device 220. The first pipeline delay is complete after the memory location (e.g., row) specified by the fifth column 334 of Row 3 has been accessed. For purposes of illustration, only write operations corresponding to the Row 1 and Row 2 (i.e., W1 and W2) are illustrated for explaining features of various embodiments. It should be noted, however, that write operations would be performed for all rows in the decoder table 300.

During the next clock cycle, the contents of the memory location (or row of the memory device) specified by the sixth column 335 of Row 3 are accessed simultaneously with writing (or updating) the contents to the same read address row utilized in the first column 310 of Row 1. This is indicated by write operation 360. Thus, the write operation in 360 utilizes the same row address as the read operation in 310. During the following clock cycle, the memory location (or row of the memory device) specified by the seventh column 336 of Row 3 is simultaneously accessed while writing to the memory location specified by the second column 311 of Row 1. This is indicated by write operation 361. Simultaneous access of the read and write locations continues until memory locations specified by the decoder table 300 have been read. At this point, the remaining values are sequentially written to the final memory locations since all the previous values have been read. According to the portion of the operations illustrated in FIG. 3B, memory locations 335-337 and 340-347 would be simultaneously accessed while writing to memory locations specified by operations 360-367 and 370-372, respectively.

As previously discussed, the pseudo two port memory device 230 can facilitate significant reductions in processing time in comparison to conventional single port memory devices that require two clock cycles to complete reading and writing operations for one row of the memory device. Consequently, the total processing time necessary for one decoder iteration using single port memory devices will be 2*M+n, where M is the number of entries in the access table and n is the pipeline delay associated with reading, processing, and writing to a given memory location. According to various embodiments, however, the pseudo two-port memory device 220 can simultaneously facilitate reading and writing operations. The total processing time necessary for one decoder iteration will be reduced to M+n clock cycles using the pseudo two-port memory device 220. Such a reduction can translate to approximately 50% of the processing time where the memory device 220 stores a typical code that is 64 k in length. As further illustrated in FIG. 2, the size of the memory device 230 does not change. Only minimal logic is required to virtually map the memory device 220 as a pseudo two port memory device 230.

Figure 4A:
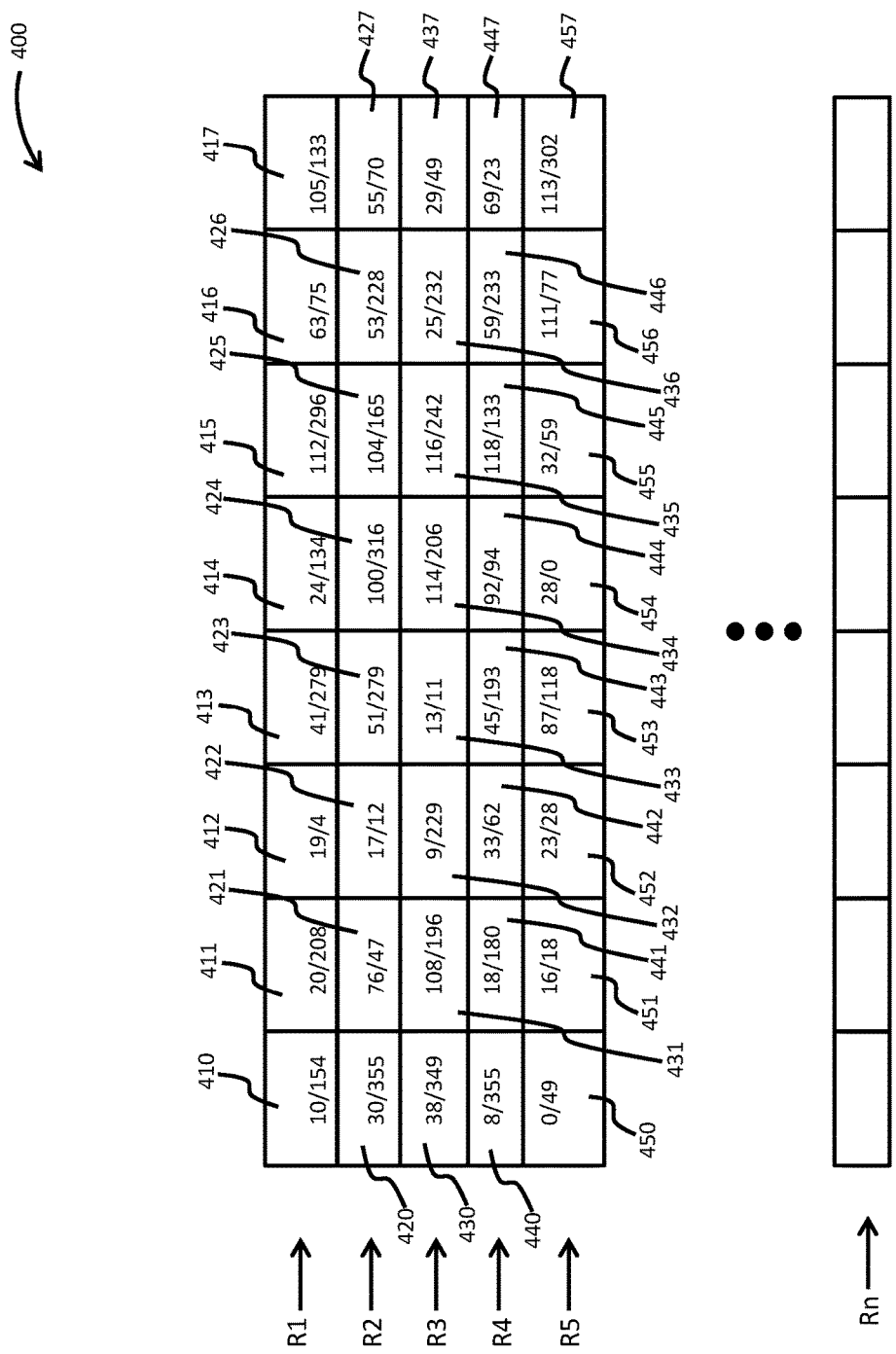
FIG. 4A illustrates a portion of a decoder access table for accessing the single port memory device as a pseudo two port memory device, according to additional embodiments.

FIG. 4A illustrates a decoder table that can be used to facilitate access to the single port memory device 220 as a pseudo two port memory device 230, in accordance with additional embodiments. The decoder table 400 includes a plurality of rows labeled R1, R2, R3, R4, R5, . . . Rn. Depending on the specific implementation, the number of rows in the decoder table 400 can vary based on the specific size and configuration of the memory device 230, the computation engine, etc. Each row of the decoder table 400 also includes a plurality of columns. Similar to the embodiment illustrated in FIG. 3A, a check node degree for accessing the memory device 220 is determined to be 8. Thus, each row of the decoder table 400 contains 8 columns. For example, Row 1 contains eight columns identified by reference numerals 410, 411, 412, 413, 414, 415, 416, and 417. Row 2 contains 8 columns identified by reference numerals 420, 421, 422, 423, 424, 425, 426, 427. Row 4 contains eight columns identified by reference numerals 430, 431, 432, 433, 434, 435, 436, and 437. Row 4 contains eight columns identified by reference numerals 440, 441, 442, 443, 444, 445, 446, and 447. Row 5 contains eight columns identified by reference numerals 450, 451, 452,

453, 454, 455, 456, and 457. Each entry in the decoder table 400 contains a row/column address value corresponding to the memory device 220.

According to various embodiments, the decoder table 400 can be configured such that adjacent columns in a particular row (R1-Rn) alternate between k*odd and k*even values for the row address, where k is a set constant for the decoder table 400. For example, if k=3, each row in the decoder table 400 would alternate between 3 even and 3 odd memory row addresses. If k=4, then each row in the decoder table 400 would alternate between 4 even and 4 odd memory row addresses. Thus, the value of k can be set to any integer, based on factors such as the physical configuration of the memory device. FIG. 3A, therefore, represents an embodiment wherein k=1.

As illustrated in FIG. 4A, the decoder table 400 is configured such that k=2. Accordingly, the first column 410 and second column 411 of Row 1 contain the values 10/154 and 20/208, while the third column 412 and fourth column 413 contain the values 19/4 and 41/279. Thus, referring to the entries in Row 1, it can be seen that the rows being accessed are labeled as 10, 20, 19, 41, 24, 112, 63, and 105, which satisfies the 2*even/2*odd alternating row format. Additionally, column one 420 and column two 421 of Row 2 identify rows 30 and 76 of the memory device 220 in order to maintain the alternating nature of the decoder table 400.

Figure 4B:
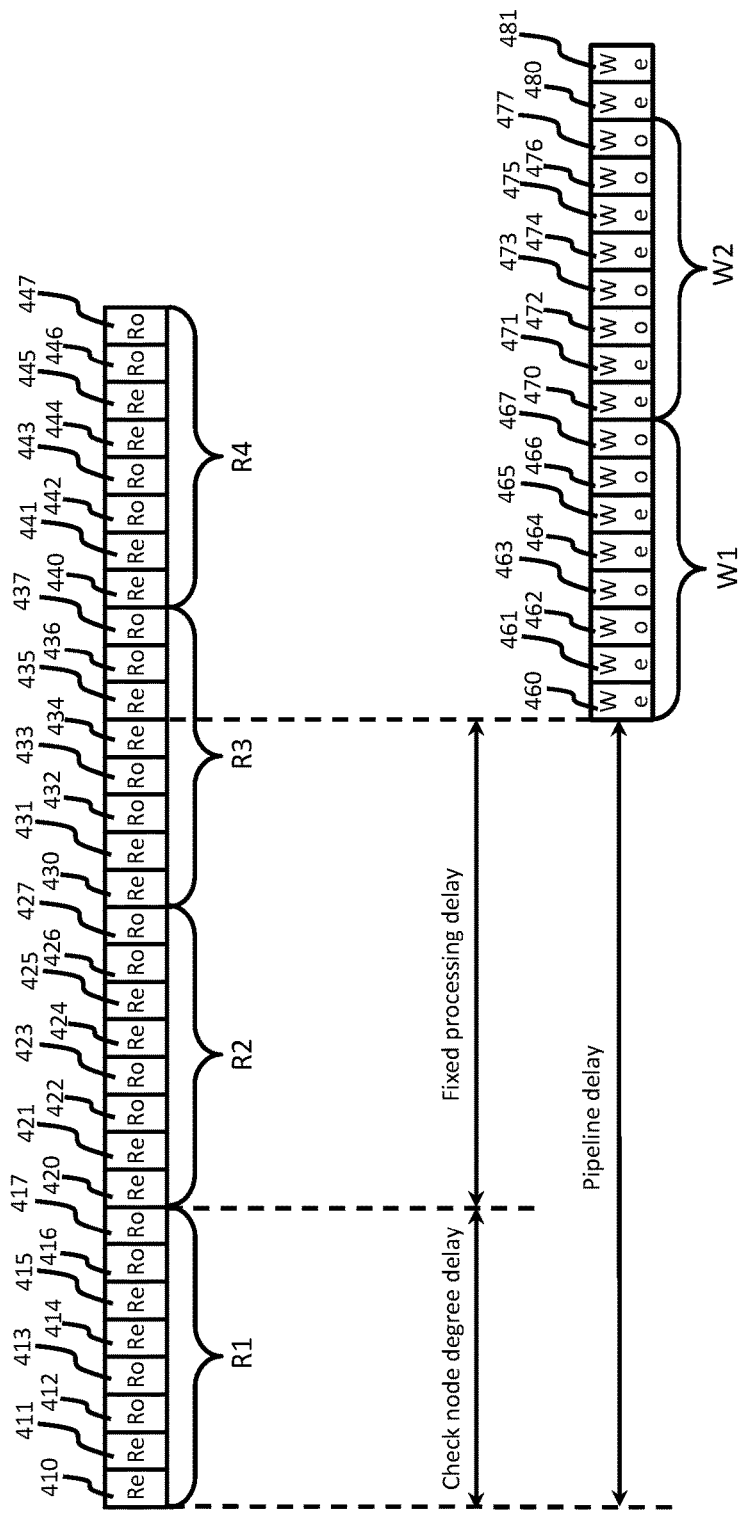
FIG. 4B is a diagram illustrating memory access for a pseudo two port memory device, according to additional embodiments.

Referring additionally to FIG. 4B, a diagram is shown for illustrating memory access using the pseudo two port memory device 230, in accordance with one or more embodiments. Entries from Row 1 of the decoder table 400 are retrieved in order to determine which row locations of the memory device 220 will be accessed. Thus, all memory addresses in a specified row are read in 2*even/2*odd alternating row format, as specified in the decoder table 400. Next, entries from Row 2 of the decoder table 400 is accessed in order to determine which row locations of the memory device 220 will be read. Similarly, entries from Row 3 and Row 4 (as well as Row 5) are accessed in order to identify which row locations of the memory device 220 should be read. Once the contents of the memory device 220 have been read, the computation engine performs various calculations and will update the contents of those memory locations when completed. As previously discussed, the processing time (or processing delay) required to perform the necessary computations is fixed based on the specific configuration of the computation engine, memory device, etc. The computation engine continues to read entries specified by the decoder table 400 until the first entry has been processed. During this time, memory access proceeds as a single port memory device.

As illustrated in FIG. 4B, the pipeline delay is complete after the memory row location specified by the fifth column 434 of Row 3 has been accessed. Only write operations corresponding to Row 1 and Row 2 (i.e., W1 and W2) are illustrated for purposes of explaining features of various embodiments. It should be noted, however, that write operations would be performed for all rows in the decoder table 400. During the next clock cycle, the contents of the memory row location specified by the sixth column 435 of Row 3 is accessed simultaneously with writing (or updating) the contents of the memory row location specified by the first column 410 of Row 1. This is indicated by write operation 460. During the following clock cycle, the memory row location specified by the seventh column 436 of Row 3 is simultaneously accessed while writing to the memory row location specified by the second column 411 of Row 1. This is indicated by write operation 461. Simultaneous access of the read and write operations continue until all memory row locations specified by the decoder table 400 have been read. At this point, the remaining values are sequentially written to the final memory row locations since all the previous values have been read. According to the portion of the operations illustrated in FIG. 4B, memory row locations 435-437 and 440-447 would be accessed while simultaneously writing to memory row locations specified by operations 460-467 and 470-472, respectively.

As illustrated in FIG. 4B, once the first pipeline delay (i.e., pipeline delay 1) has expired, all subsequent pipeline delays associated with reading/writing to the memory device become equal to the fixed processing delay. The pseudo two port memory device 230, therefore, eliminates the overhead associated with the check node degree (see FIG. 1B). The memory device can typically store information (or codes) that is 64 k bits in length. Each bit must be read, processed, and updated. The delay associated with the check node degree can, therefore, represent a significant increase in the time required to process the information stored in the memory device. As further illustrated in FIG. 2, the size of the memory device 230 does not change. Only minimal logic is required to virtually map the memory device 220 as a pseudo two port memory device 230.

Figure 5:
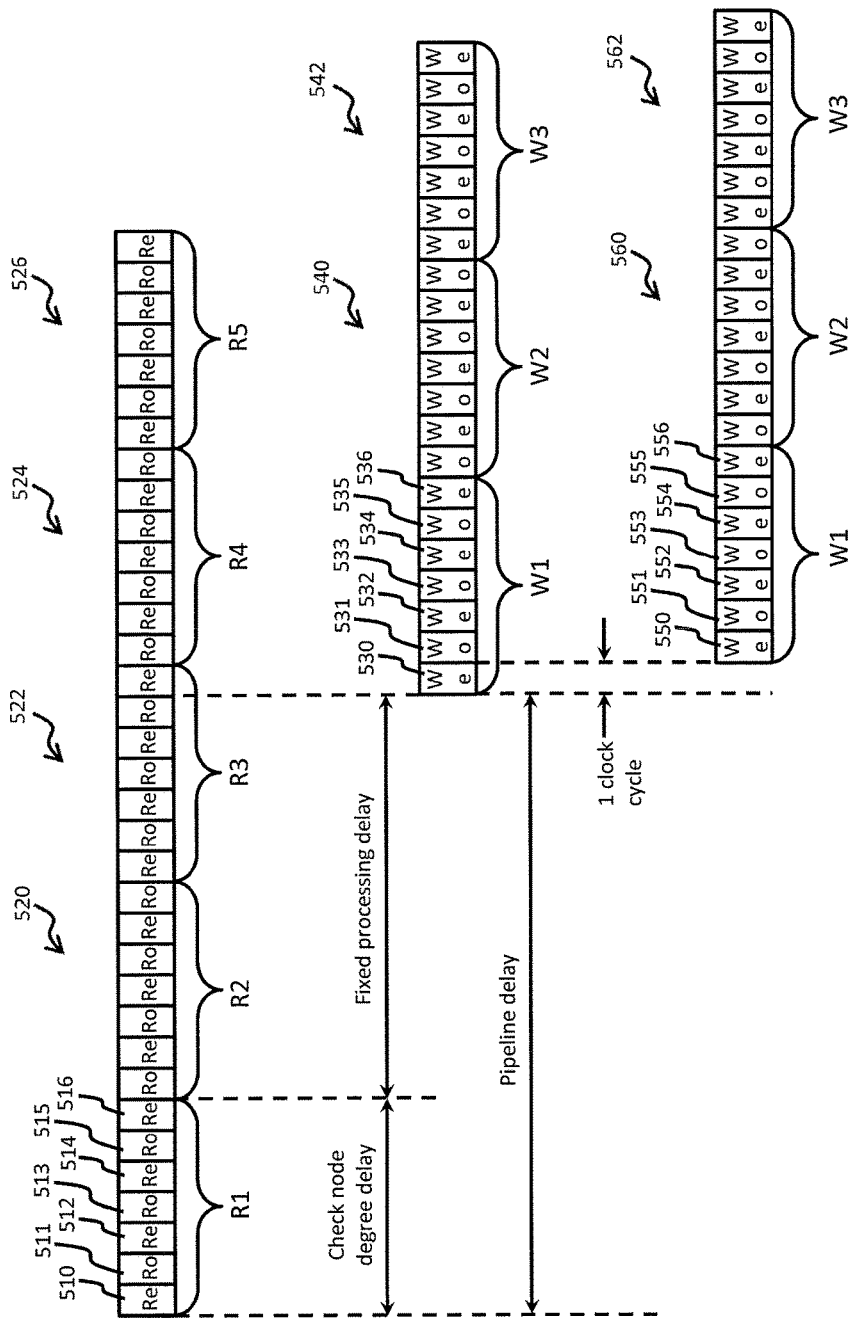
FIG. 5 is a diagram illustrating memory access for a pseudo two port memory device, according to another embodiment.

FIG. 5 illustrates memory access for the pseudo two port memory device in accordance with another embodiment. The rows of the decoder table (not shown) are provided with a check node degree of 7. Thus, each row of the decoder table contains seven columns. For example, Row 1 would contain seven entries which identify memory row locations to be accessed. The memory row locations are identified by reference numerals 510-516. Similarly, Row 2, Row 3, Row 4, and Row 5 of the decoder table 300 each contain 7 entries which identify the memory row locations to be accessed. The memory row locations (e.g., R2-R5) are identified by reference numerals 520, 522, 524, and 526, respectively. According to the illustrated embodiment, memory row locations specified by Row 1 and Row 2 of the decoder table are sequentially accessed one clock cycle at a time. Memory row locations specified by the first 6 columns of Row 3 in the decoder table are also sequentially accessed.

As illustrated in FIG. 5, the pipeline delay expires when the memory row location specified by the sixth entry 336 of Row 3 of the decoder table 300 has been read. Thus, the memory row location specified by the first column 310 of Row 1 can be updated. The write operation 530 associated with the first column 310 of Row 1 would normally occur when the memory row location specified by the seventh column 337 of Row 3 is being read. As illustrated in FIG. 5, entries from the decoder table specify reading an even row (i.e., the seventh column 337 of Row 3) and writing to an even row (write operation 530) simultaneously. Furthermore, write operations 531-536 are simultaneously performed with the Row 4 read operations 540. As further illustrated in FIG. 5, write operations 540 and 542 are simultaneously performed with read operations 524 and 526.

According to one or more embodiments, simultaneous reading/writing to even rows and simultaneous reading/writing to odd rows are not performed in order to avoid any potential memory access conflicts, such as reading and writing to the same row of the memory device. According to at least one implementation, if the sum of the check node degree and the fixed processing delay results in an even number, then one clock cycle is added to the first pipeline delay prior to performing the first write operation 530. The seventh column 337 of Row 3 would, therefore, be read alone (e.g., sequentially) in order to introduce an odd/even combination for subsequent read and write operations. The first write operation 550 would subsequently be performed simultaneously with the first read operation specified by Row 4 of the decoder table. The remaining write operations (551-556) would be performed simultaneously with respective read operations 524 specified by Row 4 of the decoder table. As can be seen from FIG. 5, these simultaneous operations result in even/odd combinations for the read operations of Row 4 (524) and write operations of Row 1 (550-556). According to such embodiments, potential memory access conflicts can be avoided.

Figure 6:
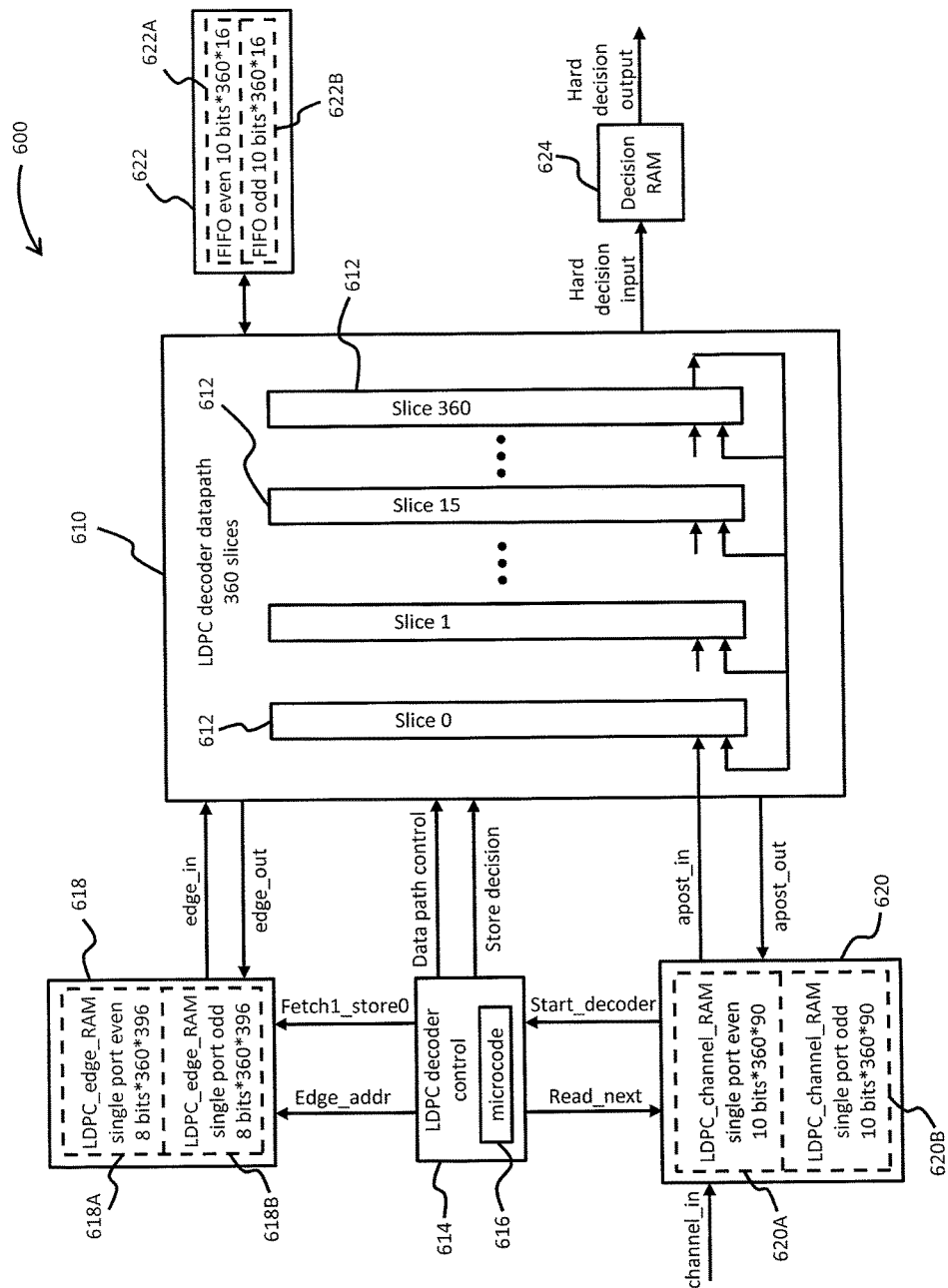
FIG. 6 is a diagram illustrating various components of an LDPC decoder incorporating a pseudo two port memory device, according to one or more embodiment.

FIG. 6 illustrates various components of a decoder 600 in accordance with one or more embodiments. The decoder 600 includes a computation engine 610 configured with a plurality of datapaths 612 capable of simultaneously performing various tasks. The datapaths 612 can be configured, for example, to retrieve information and perform various calculations. Furthermore, the datapaths 612 can supply updated information based on the results of any calculations. The decoder 600 can be configured to include various components similar to conventional decoders. As illustrated in FIG. 6, for example, the decoder 600 also includes a controller 614 and microcode 616 in order to monitor and control all activities of the computation engine. The microcode 616 can be in the form of program instructions stored in a non-volatile memory portion of the decoder 600 for execution by the controller 614. Upon execution of the microcode 616, the controller 614 would be configured to perform any operations necessary to control some, or all, aspects of the computation engine 610.

The decoder 600 illustrated in FIG. 6 also includes an edge RAM memory device 618, a channel RAM memory device 620, and a FIFO memory device 622. According to the embodiment illustrated in FIG. 6, the edge RAM memory device 618, the channel RAM memory device 620, and the FIFO memory device 622 are all configured as pseudo two port memory devices. More particularly, the edge RAM memory device 618 is configured to include a single port even bank 618A and a single port odd bank 618B. Similarly, the channel RAM memory device 620 is configured to include a single port even bank 620A and a single port odd bank 620B. The FIFO memory device 622 is also configured to include a single port even bank 622A and a single port odd bank 622B. According to the illustrated embodiment, all of the pseudo two port memory devices (618, 620, 622) can facilitate simultaneous access to the respective even and odd banks. Thus, delays associated with sequential and interleaved memory access can be significantly reduced. Furthermore, the physical size of the decoder 600 will remain substantially the same (or only increase marginally) because the memory devices remain physically the same size. Only minimal logic circuits are added, and the decoder table organization is changed.

Figure 7:
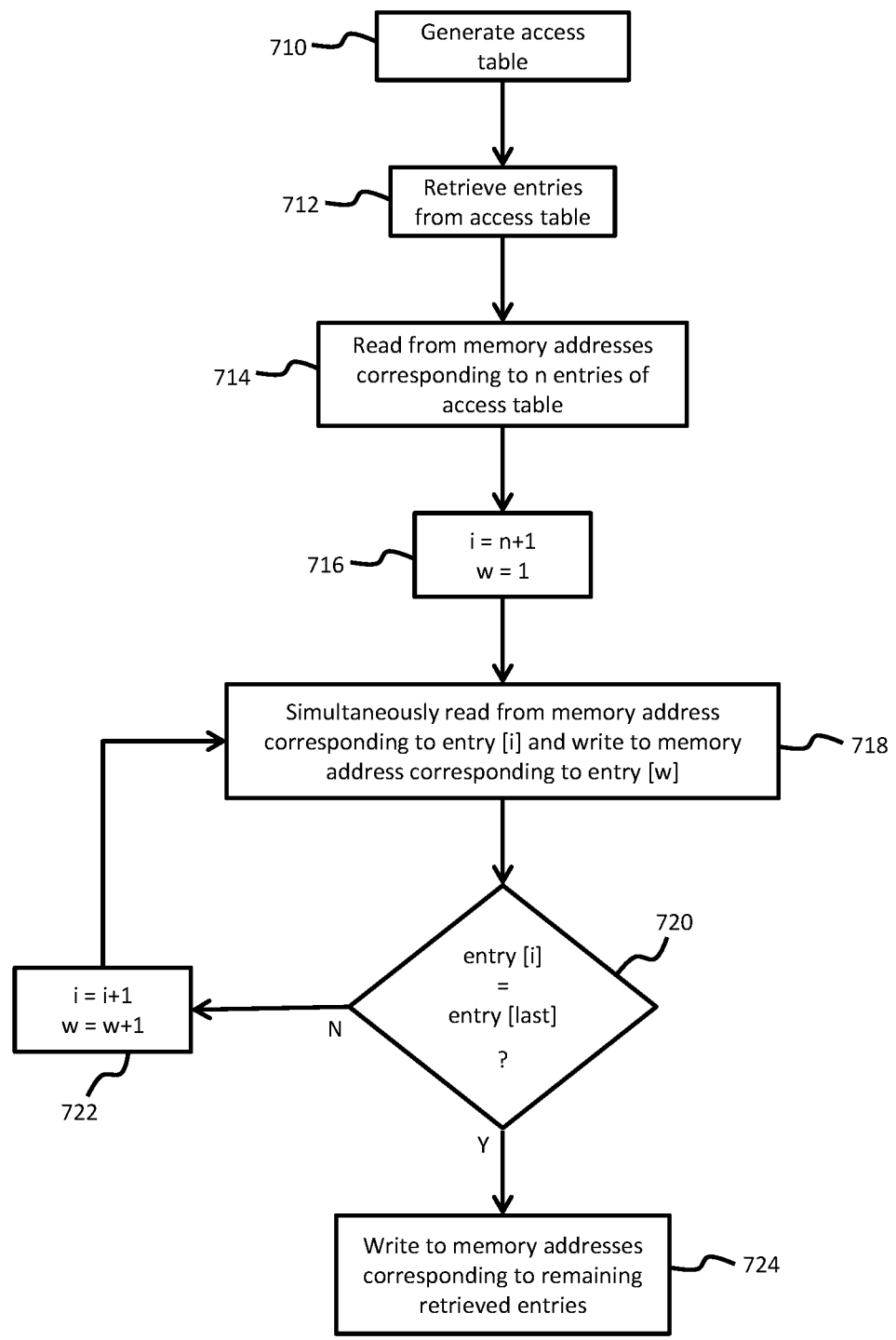
FIG. 7 is a flowchart of a process for accessing a single port memory device as a pseudo two port memory device, according to one embodiment.

FIG. 7 is a flowchart illustrating a process for accessing a single port memory device as a pseudo two port memory device in accordance with at least one embodiment. At 710, an access table is generated. Depending on the specific implementation, the access table can be in the form of a decoder table for accessing, for example, a channel RAM memory device or an edge RAM memory device. According to other embodiments, the access table can correspond to a table which facilitates access to any single port memory device as a pseudo two port memory device. According to further embodiments, the access table can be manually generated, or automatically generated by a computer using executable code which sets forth different parameters and constraints. For example, one constraint could require even/odd alternate memory row format for simultaneous read/write operations. Another constraint could insert one clock cycle in the pipeline delay prior to a sequence of simultaneous operations if the sum of the check node degree and the fixed processing delay results in an even number. A further constraint could require k*even/k*odd alternate memory row format. The value of k can be supplied from an external source (i.e., storage unit, operator, etc.). Additionally, an onboard controller unit can also be configured to generate the access table using associated microcode.

At 712, a predetermined number of entries are retrieved from the access table. Depending on the specific implementation, the number of columns in each row of the access table can vary. Each entry from the access table can include a set of values which specifies at least a row and column of different locations to be accessed in the memory device. According to various embodiments, all the entries from the access table can be retrieved at once. Alternatively, the entries can be retrieved in multiple portions as they are required. At 714, memory addresses specified by n entries from the access table are read, or retrieved. If n=3, for example, then 3 entries would be retrieved from the access table and contents of 3 rows in the memory device specified by the respective entries would be read. According to at least one embodiment, "n" corresponds to a processing delay (or processing time in clock cycles) required to perform any calculations on the retrieved values plus a check node degree delay. The processing delay and check node degree delay can also be measured in terms of clock cycles used by the memory, controller, or data bus. Thus, rows in the memory would be read sequentially until the updated content of the first row are ready at the computation engine output. As previously discussed, each entry from the access table identifies, in part, a row location within the memory device which must be accessed. This results in "n" rows of memory addresses being read sequentially one row at a time.

At 716 a variable ("i") is assigned a value of n+1, which corresponds to an index that identifies the next entry retrieved from the access table. For example, if n is determined to have a value of 21 and twenty one entries have been used to read memory addresses, then i would be assigned a value of 22. A second index ("w") is assigned a value of 1, which identifies the first entry from the access table. At 718, the memory addresses (or locations) within the row specified by the $i^{th}$ entry (i.e., entry [i]) from the access table is read, while simultaneously writing to the memory addresses (or locations) within the row specified by the $w^{th}$ entry (i.e., entry [w]) from the access table. If n=21, for example, the memory addresses from the row identified by the $22^{nd}$ entry from the access table would be read (e.g., read operation 22) while simultaneously writing (or updating) to the memory addresses from the row specified by the first entry (e.g., first write operation) from the access table. Referring additionally to FIG. 3B, this would correspond to simultaneously performing read operation 335 and write operation 360.

According to one or more embodiments, once the processing delay has expired, the memory device can be accessed as a pseudo two port memory device which allows continuous and simultaneous read/write operations. Accordingly, at 720, it is determined whether the current entry (i.e., entry [i]) corresponds to the last entry from the access table. If the current entry is not the last entry from the access table, then control passes to 722, where the variables i and w are both incremented by one. Control then returns to 718, where simultaneous read and write operations are respectively performed on the next memory addresses. More particularly, the 23$^{rd}$ entry from the access table would specify the row containing memory addresses to be read (e.g., read operation 23) while simultaneously writing to the memory addresses in the row specified by the second entry (e.g., second write operation) from the access table. Simultaneous read/write operations are performed until all memory addresses specified by entries from the access table have been read. If the i$^{th}$ entry corresponds to the last entry from the access table, then control passes to 722. This can correspond, for example, to the condition where memory row locations specified by all entries from the access table have been read, but the write operations have not been performed due to the processing delay. At 722, write operations are performed to memory row locations specified by the w$^{th}$ entry of the access table to the last entry of the access table in a sequential manner. More particularly, once all memory row locations corresponding to the retrieved entries have been read, it is no longer possible to perform simultaneous read/write operations. Thus, only write operations remain to be performed. This is similar to the sequential read operations performed before expiration of the processing delay.

Figure 8A:
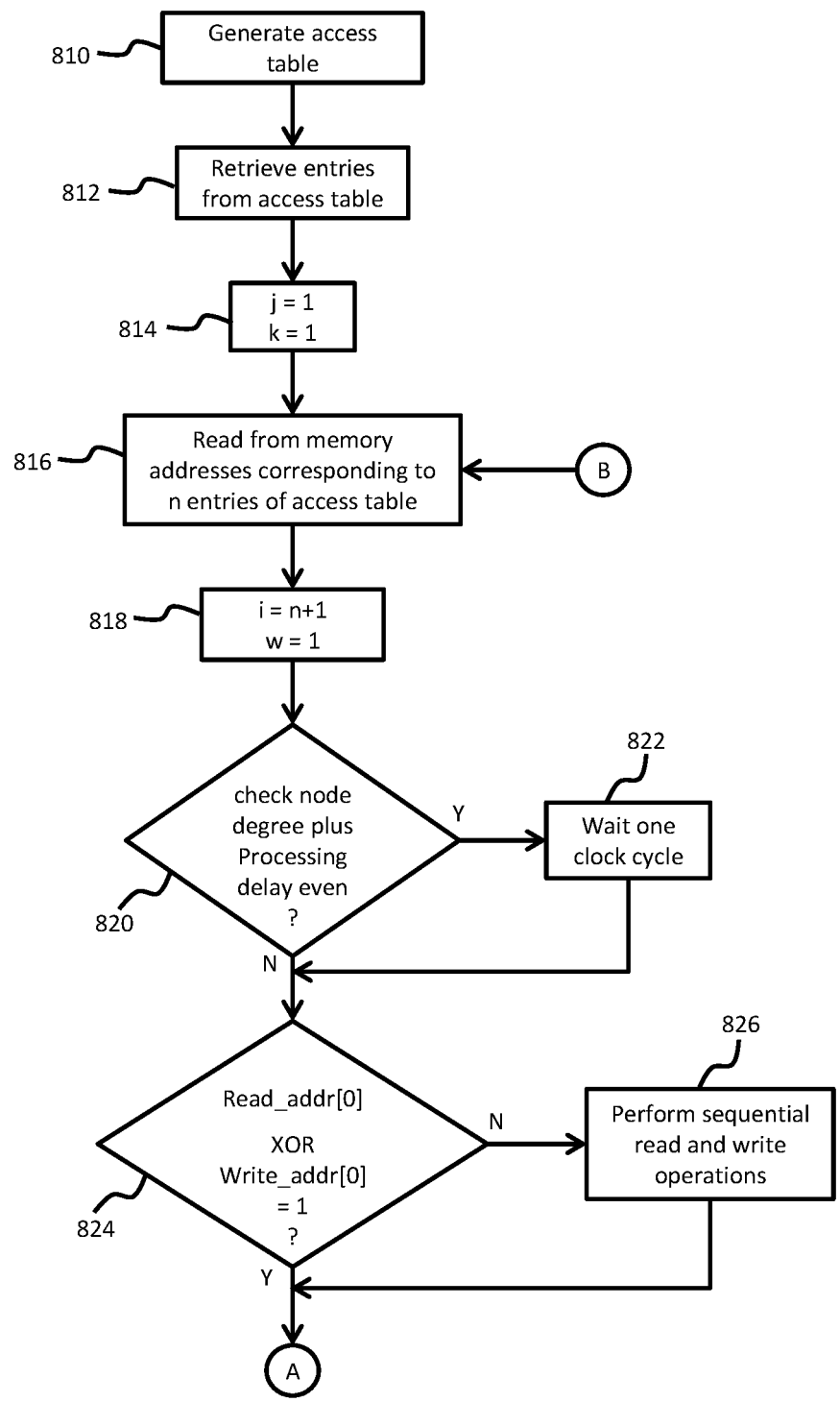
FIGS. 8A and 8B are a flowchart of a process for accessing a single port memory device as a pseudo two port memory device, according to another embodiment.
Figure 8B:
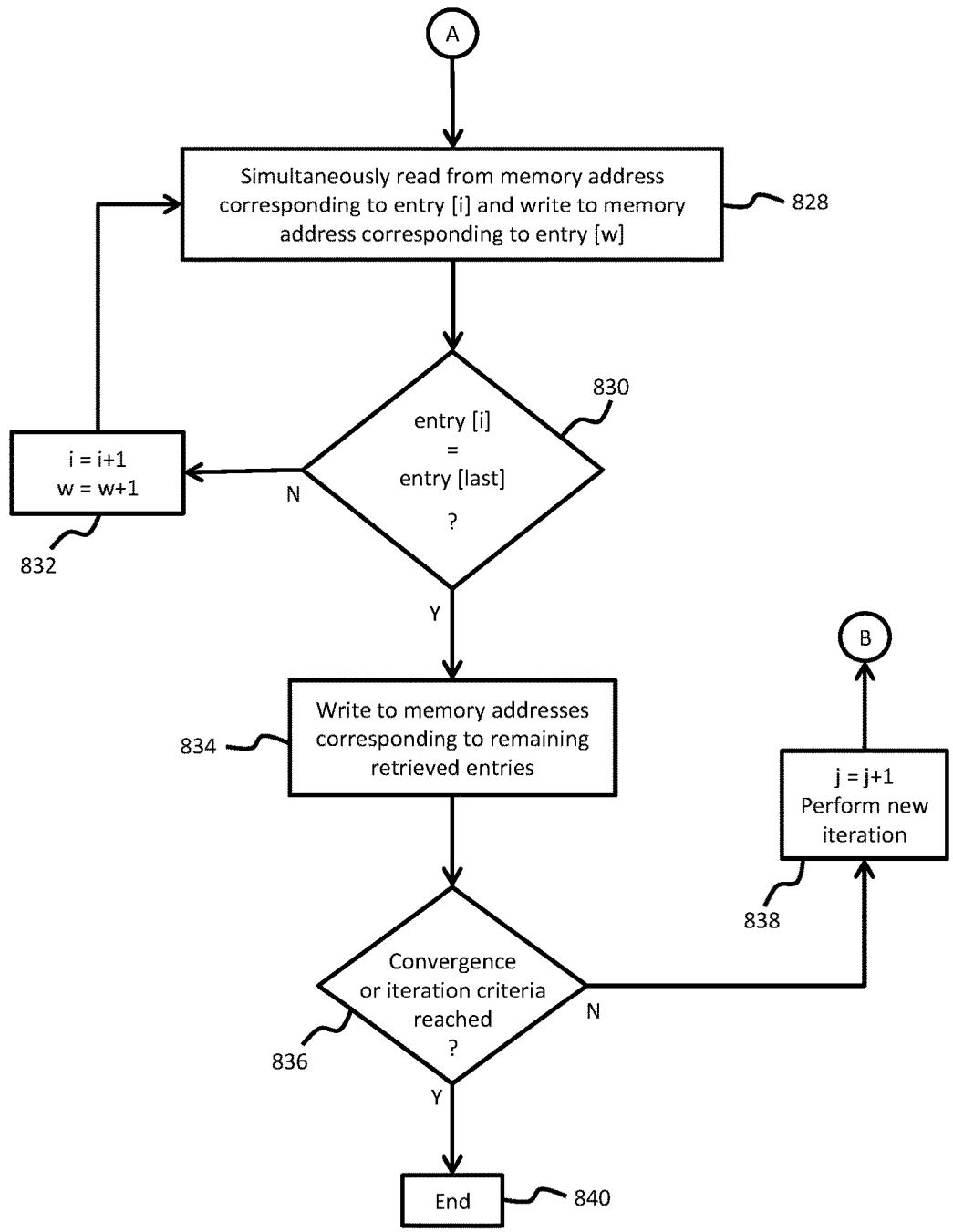

FIGS. 8A and 8B are a flowchart illustrating a process for accessing single port memory device as a pseudo two port memory device in accordance with another embodiment. At 810, and access table is generated. As previously discussed, the access table can be generated in various ways, including by the controller or a computer. According to optional embodiments, a check node degree as well as number of parallel processing engines can be provided as input to assist in generating the access table. According to at least one embodiment, the access table can be configured such that adjacent entries in each row specify locations in the memory device that alternate between odd and even values.

At 812, a predetermined number of entries are retrieved from the access table. Depending on the specific implementation, all entries can be retrieved from the access table. At 814, a counter ("j") is initialized with a value of 1, corresponding to first iteration. A second variable ("k"), corresponding to the number of even and odd entries to alternate, is also assigned a value of 1. As previously discussed, various embodiments allow configuration of the access table to include entries for accessing the memory device using k*even/k*odd alternate memory row format. Accordingly, when k=1, rows of the memory device will be accessed using even/odd alternating format. If k=2, rows of the memory device will be accessed using 2*even/2*odd alternating format. At 816, memory addresses specified by n entries from the access table are read. According to at least one embodiment, "n" corresponds to a processing delay required to perform any calculations on the retrieved values plus a check node degree delay. The processing delay and check node degree delay can be measured, for example, in terms of clock cycles used by the memory, controller, or data bus. Thus, the memory addresses would be read sequentially until calculations based on the first value read have been completed.

At 818, a variable ("i") is assigned a value of n+1, which corresponds to an index identifying the next entry retrieved from the access table. For example, if n is determined to have a value of 21 and twenty one entries have been used to read memory addresses, then i would be assigned a value of 22. A second index ("w") is initialized with a value of 1, which corresponds to the first entry from the access table. At 820, the check node degree is added to the processing delay in order to determine whether the resulting sum is an even value. If the resulting sum has an even value, then control passes to 822 where one clock cycle is used as a delay.

If the sum does not result in an even value, control passes to 824 where an exclusive or operation (XOR) is performed between the last bit of the current read address and the last bit of the current write address. If the exclusive or operation (XOR) does not equal one, then control passes to 826 where read and write operations are sequentially performed. More particularly, the read and write operations can be interleaved together and performed sequentially. If the exclusive or operation results in a value of one, simultaneous read and write operations are initiated at 828. At 828, the memory address (or location) specified by the i$^{th}$ entry (i.e., entry [i]) from the access table is read, while simultaneously writing to the memory address (or location) specified by the w$^{th}$ entry (i.e., entry [w]) from the access table. If n=21, for example, the memory address identified by the 22$^{nd}$ entry from the access table would be read (e.g., read operation 22) while simultaneously writing (or updating) to the memory address specified by the first entry (e.g., first write operation) from the access table. Referring additionally to FIG. 3B, this would correspond to simultaneously performing read operation 335 and write operation 360.

At 830, it is determined whether the current entry (i.e., entry [i]) corresponds to the last entry from the access table. If the current entry is not the last entry from the access table, then control passes to 832, where the variables i and w are both incremented by one. Control then returns to 828, where simultaneous read and write operations are respectively performed on the next memory addresses. More particularly, the 23$^{rd}$ entry from the access table would be read while simultaneously writing to the memory address specified by the second entry from the access table. Simultaneous read/write operations continue until all memory addresses specified by entries from the access table have been read. If the i$^{th}$ entry corresponds to the last entry from the access table, then control passes to 834. Write operations are performed to memory locations specified by the w$^{th}$ entry of the access table to the last entry of the access table (e.g., entry [w] to entry [last]) in a sequential manner.

At 836 it is determined whether the appropriate convergence (i.e., confidence level) or iteration criteria has been reached. As previously discussed a convergence criteria can be set for determining if the current values (soft decisions) stored in the memory device should be updated or output as hard decisions. Furthermore, a value corresponding to a predetermined number of iterations can be used to determine when the current values stored in the memory device should be output as hard decisions. According to the illustrated embodiment, such a determination can be made by comparing the variable j to a predetermined iteration_max. If the convergence or iteration criteria has not been reached, then control passes to 838 in order to increment the value of j and perform another iteration. According to at least one embodiment, control returns to 816 where memory addresses for the first n entries of the access table are read. If it is determined, at 836, that the convergence or iteration criteria has been reached, then the process ends at 840.

The processes described herein may be implemented, in accordance with one or more exemplary embodiments, via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below.

Figure 9:
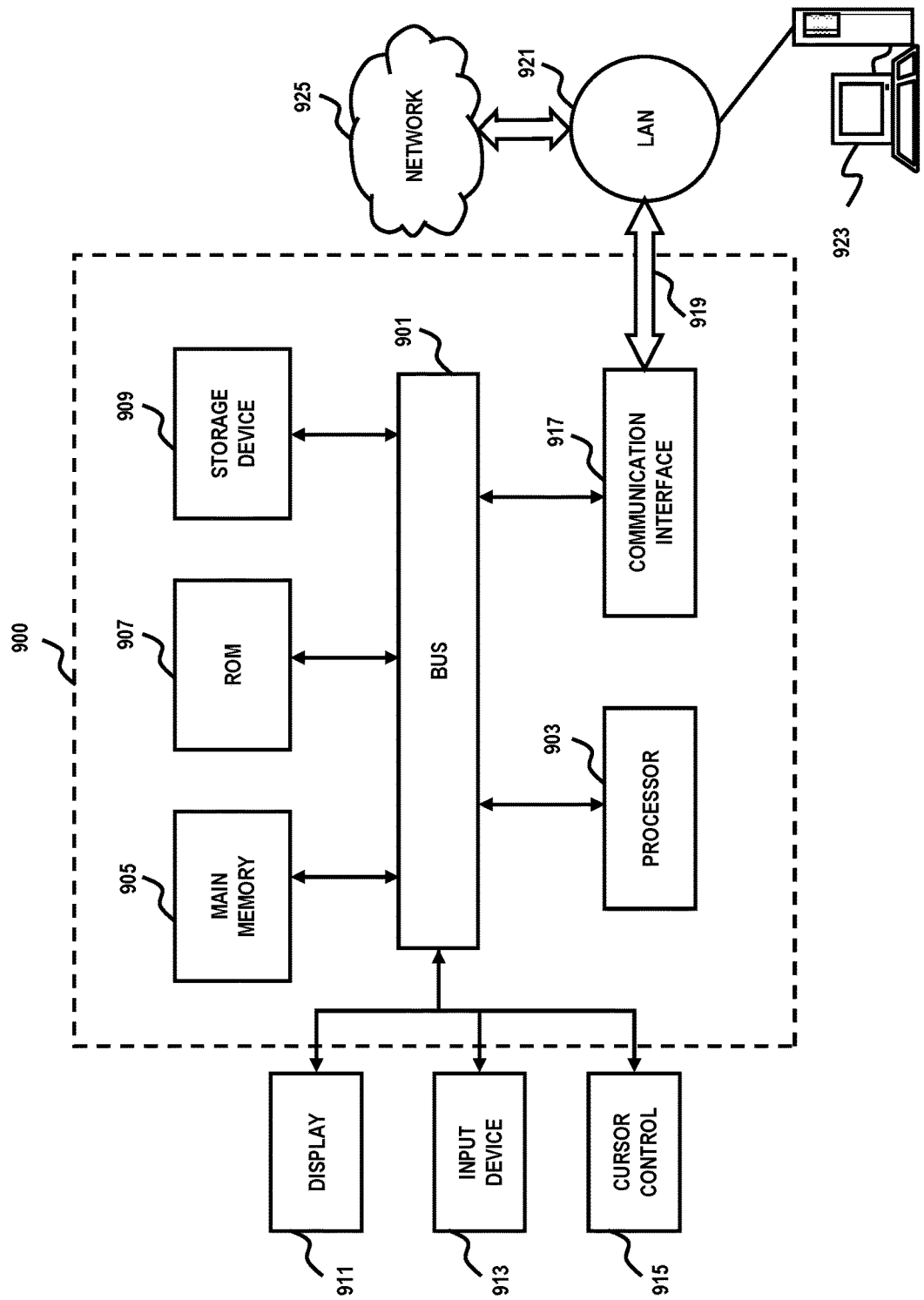
FIG. 9 is a diagram of a computer system that can be used to implement various exemplary embodiments.

FIG. 9 is a diagram of a computer system that can be used to implement various embodiments. The computer system 900 includes a bus 901 or other communication mechanism for communicating information and a processor 903 coupled to the bus 901 for processing information. The computer system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions by the processor 903. The computer system 900 may further include a read only memory (ROM) 907 or other static storage device coupled to the bus 901 for storing static information and instructions for the processor 903. A storage device 909, such as a magnetic disk or optical disk, is coupled to the bus 901 for persistently storing information and instructions.

The computer system 900 may be coupled via the bus 901 to a display 911, such as a light emitting diode (LED) or other flat panel displays, for displaying information to a computer user. An input device 913, such as a keyboard including alphanumeric and other keys, is coupled to the bus 901 for communicating information and command selections to the processor 903. Another type of user input device is a cursor control 915, such as a mouse, a trackball, or cursor direction keys, for communicating direction information and command selections to the processor 903 and for controlling cursor movement on the display 911. Additionally, the display 911 can be touch enabled (i.e., capacitive or resistive) in order facilitate user input via touch or gestures.

According to an exemplary embodiment, the processes described herein are performed by the computer system 900, in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement exemplary embodiments. Thus, exemplary embodiments are not limited to any specific combination of hardware circuitry and software.

The computer system 900 also includes a communication interface 917 coupled to bus 901. The communication interface 917 provides a two-way data communication coupling to a network link 919 connected to a local network 921. For example, the communication interface 917 may be a digital subscriber line (DSL) card or modem, an integrated services digital network (ISDN) card, a cable modem, fiber optic service (FiOS) line, or any other communication interface to provide a data communication connection to a corresponding type of communication line. As another example, communication interface 917 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 917 sends and receives electrical, electromagnetic, or optical signals that carry digital data streams representing various types of information. Further, the communication interface 917 can include peripheral interface devices, such as a Universal Serial Bus (USB) interface, a High Definition Multimedia Interface (HDMI), etc. Although a single communication interface 917 is depicted in FIG. 9, multiple communication interfaces can also be employed.

The network link 919 typically provides data communication through one or more networks to other data devices. For example, the network link 919 may provide a connection through local network 921 to a host computer 923, which has connectivity to a network 925 such as a wide area network (WAN) or the Internet. The local network 921 and the network 925 both use electrical, electromagnetic, or optical signals to convey information and instructions. The signals through the various networks and the signals on the network link 919 and through the communication interface 917, which communicate digital data with the computer system 900, are exemplary forms of carrier waves bearing the information and instructions.

The computer system 900 can send messages and receive data, including program code, through the network(s), the network link 919, and the communication interface 917. In the Internet example, a server (not shown) might transmit requested code belonging to an application program for implementing an exemplary embodiment through the network 925, the local network 921 and the communication interface 917. The processor 903 may execute the transmitted code while being received and/or store the code in the storage device 909, or other non-volatile storage for later execution. In this manner, the computer system 1000 may obtain application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as the storage device 909. Non-volatile media can further include flash drives, USB drives, microSD cards, etc. Volatile media include dynamic memory, such as main memory 905. Transmission media include coaxial cables, copper wire and fiber optics, including the wires that comprise the bus 901. Transmission media can also take the form of acoustic, optical, or electromagnetic waves, such as those generated during radio frequency (RF) and infrared (IR) data communications. Common forms of computer-readable media include, for example, a USB drive, microSD card, hard disk drive, solid state drive, optical disk (e.g., DVD, DVD RW, Blu-ray), or any other medium from which a computer can read.

FIG. 10 illustrates a chip set 1000 upon which an embodiment of the invention may be implemented. Chip set 1000 is programmed to implement various features as described herein and includes, for instance, the processor and memory components described with respect to FIG. 10 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 1000, or a portion thereof, constitutes a means for performing one or more steps of the figures.

In one embodiment, the chip set 1000 includes a communication mechanism such as a bus 1001 for passing information among the components of the chip set 1000. A processor 1003 has connectivity to the bus 1001 to execute instructions and process information stored in, for example, a memory 1005. The processor 1003 may include one or more processing cores with each core configured to perform independently. A multi-core processor enables multiprocessing within a single physical package. Examples of a multi-core processor include two, four, eight, or greater numbers of processing cores. Alternatively or in addition, the processor 1003 may include one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 includes both dynamic memory (e.g., RAM, magnetic disk, re-writable optical disk, etc.) and static memory (e.g., ROM, CD-ROM, DVD, BLU-RAY disk, etc.) for storing executable instructions that when executed perform the inventive steps described herein to controlling a set-top box based on device events. The memory 1005 also stores the data associated with or generated by the execution of the inventive steps.

While certain exemplary embodiments and implementations have been described herein, other embodiments and modifications will be apparent from this description. Accordingly, the various embodiments described are not intended to be limiting, but rather are encompassed by the broader scope of the presented claims and various obvious modifications and equivalent arrangements.

What is claimed is:

1. A method comprising:
   generating an access table for mapping a single port memory device to a pseudo two port memory device including a single port even bank and a single port odd bank;
   sequentially retrieving entries from the access table;
   reading from addresses in the single port memory device corresponding to n entries of the retrieved entries, where n corresponds to pipeline delay measured in CPU clock cycles;
   conducting simultaneous operations for reading from addresses in the single port memory device corresponding to remaining entries from the access table and for writing to addresses in the single port memory device corresponding to entries from the access table, starting from the first retrieved entry and delayed by n clock cycles, until all addresses in the single port memory device corresponding to the retrieved entries have been read; and
   writing to addresses in the single port memory device corresponding to any remaining entries from the access table.

2. The method of claim 1, wherein each entry of the access table specifies, in part, alternating k*odd/k*even row addresses to be accessed in the single port memory device, where:

$1 \leq k \leq M/2$ k is an integer, and
   M is the total number of entries in the access table.

3. The method of claim 1, wherein the access table is a channel memory access table for a Low Density Parity Check (LDPC) decoder.

4. The method of claim 3, wherein a number of columns in each row of the access table is determined based, at least in part, on a check node degree of the LDPC decoder.

5. The method of claim 4, wherein the check node degree is based on a code design and parallelism of processing engine for the LDPC decoder.

6. The method of claim 4, wherein a sum of the processing delay plus the check node degree results in an even value, and further comprising waiting one clock cycle prior to performing the step of conducting simultaneous operations.

7. The method of claim 1, wherein conducting simultaneous operations is performed only when Read_address[0] XOR Write_address[0] equals 1, where
   Read_address[0] is a last bit of the address in the memory location being read, and
   Write_address[0] is a last bit of the address in the memory location being written.

8. The method of claim 1, further comprising:
   determining if a convergence criteria or iteration criteria has been satisfied; and
   repeating the sequentially retrieving, reading from addresses in the single port memory device corresponding to n entries, conducting simultaneous operations, and writing to addresses, if the convergence criteria or iteration criteria has not been satisfied.

9. An apparatus comprising:
   a single port memory device;
   a pseudo two port memory device including a single port even bank and a single port odd bank; and
   a controller, including microcode containing one or more instructions for configuring the controller to:
     generate an access table for mapping the single port memory device to the pseudo two port memory device,
     sequentially retrieve entries from the access table,
     read from addresses in the single port memory device corresponding to n entries of the retrieved entries, where n corresponds to a pipeline delay measured in controller clock cycles,
     conduct simultaneous operations for reading from addresses in the single port memory device corresponding to remaining entries from the access table and for writing to addresses in the single port memory device corresponding to entries from the access table, starting from the first retrieved entry and delayed by n clock cycles, until all addresses in the single port memory device corresponding to the retrieved entries have been read, and
     write to addresses in the single port memory device corresponding to any remaining entries from the access table,
   wherein reading and writing operations to the single port memory device are performed via the pseudo two port memory device.

10. The apparatus of claim 9, wherein each entry of the access specifies, in part, alternating k*odd/k*even row addresses to be accessed in the single port memory device, where:

$1 \leq k \leq M/2$ k is an integer, and
    M is the total number of entries in the access table.

11. The apparatus of claim 9, further comprising:
a Low Density Parity Check (LDPC) computation engine, wherein the access table is a channel memory access table for the LDPC computation engine.

12. The apparatus of claim 11, wherein a number of columns in each row of the access table is determined based, at least in part, on a check node degree of the LDPC decoder.

13. The apparatus of claim 12, wherein the check node degree is based on a code design and parallelism of processing engine for the LDPC decoder.

14. The apparatus of claim 12, wherein a sum of the processing delay plus a check node degree results in an even value, and further comprising waiting one clock cycle prior to performing the step of conducting simultaneous operations.

15. The apparatus of claim 9, wherein conducting simultaneous operations is performed only when Read_address[0] XOR Write_address[0] equals 1, where
   Read_address[0] is a last bit of the address in the memory location being read, and
   Write_address[0] is a last bit of the address in the memory location being written.

16. The apparatus of claim 9, wherein the controller is further configured to:
   determine if a convergence criteria or iteration criteria has been satisfied; and
   repeat the following: sequentially retrieve, read from addresses in the single port memory device corresponding to n entries, conduct simultaneous operations, and write to addresses, if the convergence criteria or iteration criteria das not been satisfied.

* * * * *

UNITED STATES PATENT AND TRADEMARK OFFICE
CERTIFICATE OF CORRECTION

PATENT NO. : 10,168,938 B2
APPLICATION NO. : 15/361227
DATED : January 1, 2019
INVENTOR(S) : Liping Chen et al.

It is certified that error appears in the above-identified patent and that said Letters Patent is hereby corrected as shown below:

In the Claims

Column 18 Line 60 Claim 10 should read:
10. The apparatus of claim 9, wherein each entry of the access table specifies, in part, alternating k*odd/k*even row addresses to be accessed in the single port memory device, where:
$1 \leq k \leq M/2$
k is an integer, and
M is the total number of entries in the access table.

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*